United States Patent
Alexopoulos et al.

(10) Patent No.: US 6,608,603 B2
(45) Date of Patent: Aug. 19, 2003

(54) ACTIVE IMPEDANCE MATCHING IN COMMUNICATIONS SYSTEMS

(75) Inventors: Nicolaos G. Alexopoulos, Santa Monica, CA (US); Franco De Flaviis, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 4 days.

(21) Appl. No.: 09/935,701

(22) Filed: Aug. 24, 2001

(65) Prior Publication Data

US 2003/0052832 A1 Mar. 20, 2003

(51) Int. Cl.$^7$ ................................................ H03H 7/40
(52) U.S. Cl. ........................................ 343/860; 330/144
(58) Field of Search ..................... 343/860; 330/144, 330/284, 129, 145, 279; 363/15, 40, 95; 333/17

(56) References Cited

U.S. PATENT DOCUMENTS 3,794,941 A * 2/1974 Templin ........................ 333/17
5,880,635 A * 3/1999 Satoh ........................... 330/144
6,101,102 A * 8/2000 Brand et al. .................. 363/15

OTHER PUBLICATIONS

Mueller et al., "Ferroelectric Thin Film & Broadband Satellite Systems," *IEEE Potentials*, IEEE, Apr./May 2001, pp. 36–39.

* cited by examiner

*Primary Examiner*—James Clinger
(74) *Attorney, Agent, or Firm*—Sterne, Kessler, Goldstein & Fox PLLC

(57) ABSTRACT

A signal sensing module senses an RF signal and produces one or more secondary signals representative of the RF signal. An impedance matching control module generates a control signal, based on the one or more secondary signals, which is indicative of an impedance mismatch between a load and a communications device. The control signal is then applied to at least one variable impedance device to adjust the impedance of an impedance matching network and thereby reduce the impedance mismatch between the load and the communications device. In an embodiment, the at least one variable impedance device is a barium strontium titanate, thin film, parallel plate capacitor. In other embodiments, other variable impedance devices such as other types of thin film capacitors or varactor diodes are be used to adjust the impedance of the impedance matching network.

20 Claims, 10 Drawing Sheets

ACTIVE IMPEDANCE MATCHING IN COMMUNICATIONS SYSTEMS

FIELD OF THE INVENTION

The present invention relates to communications. More particularly, the present invention relates to a system and method for active impedance matching in communications systems.

BACKGROUND OF THE INVENTION

In communications systems, it is important that the impedance of a load (e.g., an antenna or a cable) connected to a communication device be matched to the impedance of the device. A mismatch of load and device impedances causes power reflections at the point of connection that result, for example, in reduced efficiency, bandwidth and in reduced signal-to-noise ratio. Thus, if the impedance of a load does not match the impedance of a communications device, the load is typically connected to the device using an impedance matching circuit.

A particular problem encountered in wireless communications systems is that the impedance of an antenna typically changes with time due to the changing presence of obstacles (e.g., humans) in the vicinity of the antenna. In the frequency range from about 20 MHz up to about 1.5 GHz, the human body acts predominantly as a reflector with varying degrees of efficiency. Thus, the presence of one or more human bodies nearby an antenna will produce an increase in the capacitive nature of the antenna impedance, and thereby generate an impedance mismatch at the point of connection between the antenna and a wireless communications device.

As would be known to a person skilled in the relevant communications art, a human body proximate to an antenna affects the impedance of the antenna. As a person moves either closer to or further away from an antenna, the change in the relative position of the person proximate to the antenna causes the impedance of the antenna to change. A human body close to an antenna presents a low impedance to an RF wave. The presence of a human body reduces the electric field of an RF wave close by, and it increases the magnetic field. At a distance of a quarter wavelength away from the body, a high impedance is presented to an approaching RF wave front, which enhances the electric field while reducing the magnetic field. This effect is periodic, and it repeats each quarter of a wavelength of the RF wave. Furthermore, on the far side of a human body from a transmitter, there is a deep null in a transmitted RF wave caused by the absorption of the wave by the human body. Absorption affects both the electric field and the magnetic field of an RF wave.

While impedance matching circuits are known in the communications technology, the impedances of these known circuits do not change with time in order to match a load whose impedance changes with time. Consequently, in order to minimize the effects of load (antenna) impedance mismatch, wireless communication systems are typically over designed. Generally speaking, because of the nature of wireless communications links, it is impossible to predict where and under what environmental conditions a wireless communications device and its antenna will operate. As a result, in a well designed wireless communications system, an antenna should be insensitive to the presence of nearby objects and, in particular, to the presence of a human body. This requirement sets constrains on the antenna quality factor (Q) (i.e., Q must be designed to have less than a given value). In a wireless communications system, the Q of an antenna should be designed so that it satisfies EQ. 1:

$$Q < (C/\Delta C) \qquad \text{EQ. 1}$$

where C is the tuning capacitance, and $\Delta C$ is the change of capacitance induced into the antenna, for example, by the proximity of a human body. For an air cored loop antenna, a typical value for C is 16 pF, and a typical value for $\Delta C$ is 0.2 pF (i.e., Q must be less than 80). The typical resistance of a small loop antenna is very low (e.g., less than 2Ω), and thus an impedance matching circuit is required even for free space radiation.

As would be understood by a person skilled in the relevant communications technology, the over design of wireless communications systems increases the cost of wireless communications. It also reduces the operational life time of portable wireless communication devices due to higher energy consumption requirements and battery drain.

What is needed is a means for matching the impedance of a load to the impedance of a communications device, which overcomes the deficiencies of known impedance matching circuits.

BRIEF SUMMARY OF THE INVENTION

The present invention is directed to a system and method for active impedance matching in communications systems. A signal sensing module senses an RF signal and produces one or more secondary signals representative of the RF signal. An impedance matching control module generates a control signal, based on the one or more secondary signals, which is indicative of an impedance mismatch between a load and a communications device. The control signal is then applied to at least one variable impedance device to adjust the impedance of an impedance matching network and thereby reduce the impedance mismatch between the load and the communications device.

In an embodiment, a barium strontium titanate, thin film, parallel plate capacitor is used as a variable impedance device to adjust the impedance of the impedance matching network. In other embodiments, other variable impedance devices such as other types of thin film capacitors or varactor diodes can be used to adjust the impedance of the impedance matching network.

A feature of the present invention enhances the bandwidth and/or signal-to-noise ratio of a communications system.

Another feature of the invention enhances the operating range and battery life of portable wireless communications devices.

Further features and advantages of the present invention, as well as the structure and operation of various embodiments of the present invention, are described in detail below with reference to the accompanying drawings.

BRIEF DESCRIPTION OF THE DRAWINGS/FIGURES

The present invention is described with reference to the accompanying figures. In the figures, like reference numbers indicate identical or functionally similar elements. Additionally, the leftmost digit or digits of a reference number identify the figure in which the reference number first appears. The accompanying figures, which are incorporated herein and form part of the specification, illustrate the present invention and, together with the description, further serve to explain the principles of the invention and to enable a person skilled in the relevant art to make and use the invention.

DETAILED DESCRIPTION OF THE INVENTION

The present invention provides a method and system for active impedance matching in communications systems. As described herein, the present invention is particularly well adapted for use with wireless communications devices. As will become apparent to a person skilled in the relevant communications art given the detailed description of the invention herein, it is a feature of the present invention that there is no need to reduce the Q of an antenna so that a higher gain can be achieved when using an impedance matching network according to the invention. The invention, however, is not limited to being used with wireless communications devices.

Terminology

The following terms are defined so that they may be used to describe embodiments of the present invention. As used herein:

"Communications device" means a transmitter, a receiver, a transceiver, or any combination thereof for transmitting and/or receiving a RF signal.

"Load" means any impedance coupled to a communications device such as, for example, an antenna or a cable.

"Port" means any node of a circuit or network capable of serving as a electromagnetic coupling point.

Example System Embodiments of the Present Invention

Figure 1:
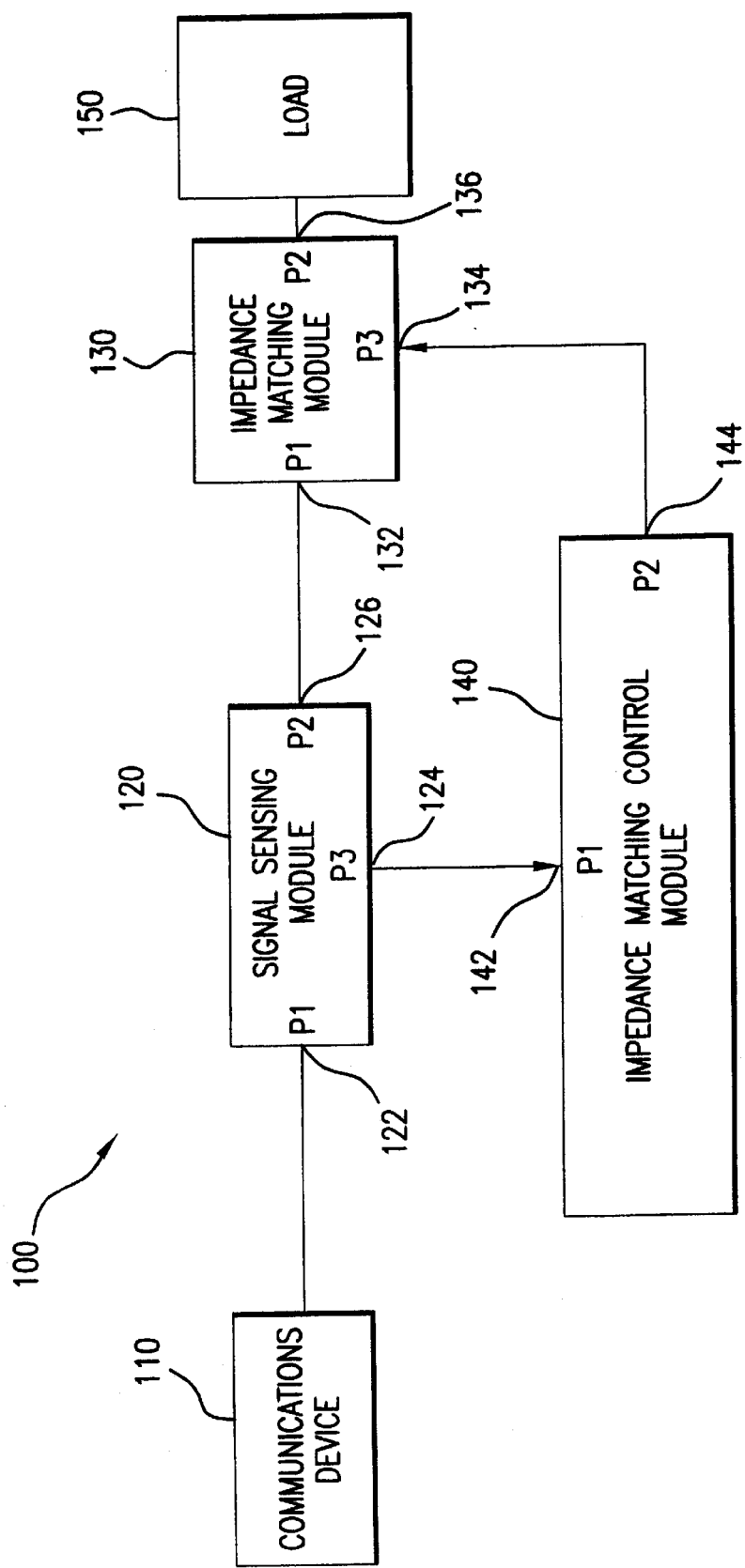
FIG. 1 illustrates a system for active impedance matching according to the present invention.

FIG. 1 illustrates a communications system 100 according to an embodiment of the present invention. System 100 comprises a communications device 110, a signal sensing module 120, an impedance matching module 130, an impedance matching control module 140, and a load 150, which are coupled together as shown in FIG. 1. As described herein, the logic and the active control devices of system 100, as well as the logic and the active control devices other system embodiments of the invention, can be implemented using standard CMOS technology.

Communication device 110 comprises a receiver, a transmitter, and/or a transceiver, or any combination thereof. The function of communications device 110 is to generate an RF information signal from a baseband information signal and/or to generate a baseband information signal from an RF information signal, in a manner that would be known to one skilled in the relevant communications art. Communications device 110 can comprise any device that up-converts and/or down-converts electromagnetic signals of the type used for RF communications.

Signal sensing module 120 is used to sense a transmitted and/or received RF signal. Signal sensing.module 120 has at least three ports 122, 124, and 126 for coupling to other devices of communications system 100. For example, as illustrated in FIG. 1, port 122 of signal sensing module 120 is coupled to communications device 110. Port 124 is coupled to impedance matching module 140. Port 126 is coupled to impedance matching module 130. As described herein, signal sensing module 120 can have more than three port (See, e.g., FIG. 3).

Figure 2:
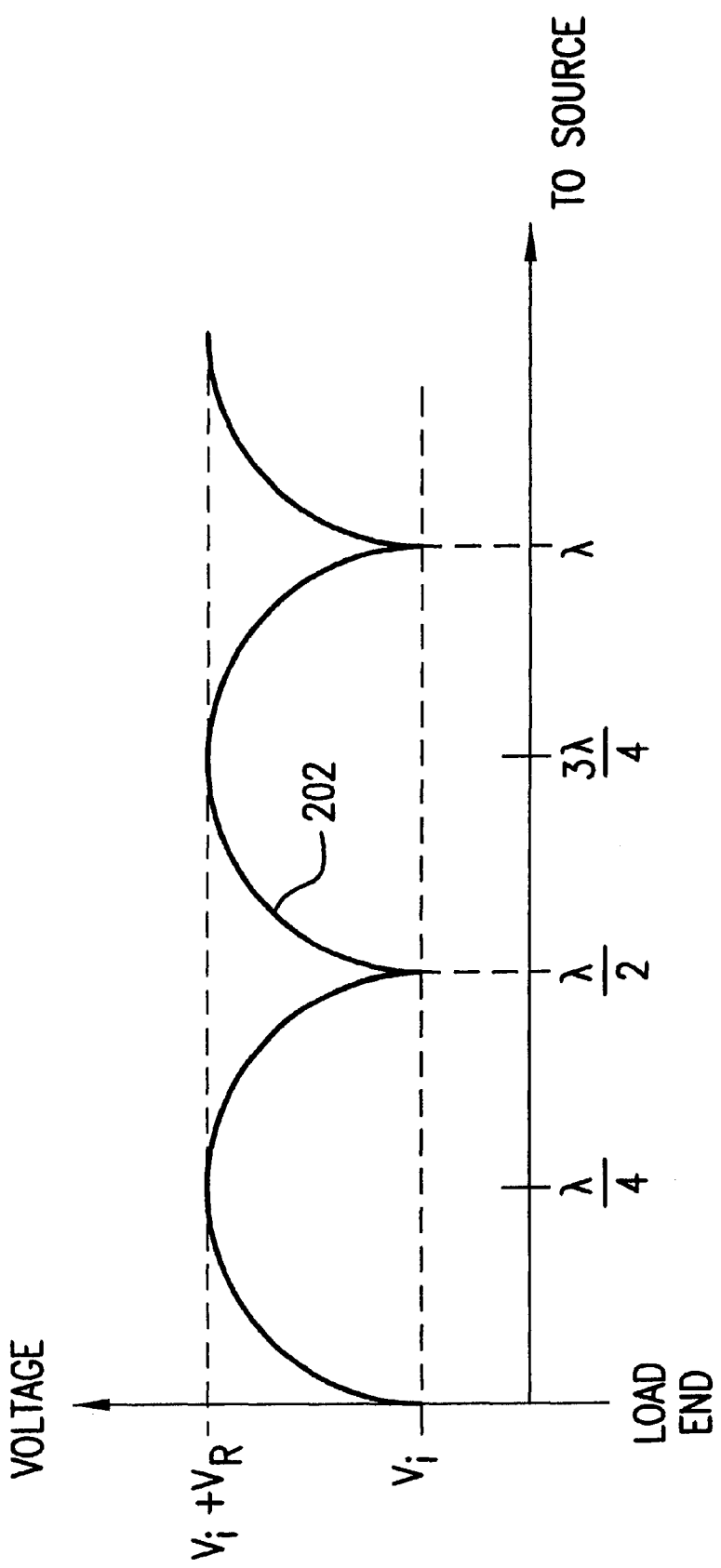
FIG. 2 illustrates an example of voltage standing wave.

Signal 202 in FIG. 2 illustrates an example voltage standing wave produced by an impedance mismatch between load 150 and communications device 110. In an embodiment of the invention, signal sensing module 120 generates two voltage signals. One voltage signal is proportional to the incident voltage ($V_i$) at load 150, and a second voltage signal is proportional to the reflected voltage ($V_r$). These values are illustrated in FIG. 2. Alternatively, signal sensing module 120 may generate a single signal proportional to the voltage standing wave ratio (VSWR) of signal 202 or a single signal proportional to a current standing wave ratio (ISWR) of a sensed signal (not shown). The value of either a VSWR or a ISWR is indicative of the impedance mismatch between load 150 and communications device 110. Other possibilities for generating one or more signals to represent the sensed RF signal also exist, as would be known to a person skilled in the relative communications art.

Impedance matching module 130 is used to match an impedance of load 150 to an impedance of communications device 110. As described herein, impedance matching module 130 comprises one or more devices whose impedance can be varied in order to reduce an impedance mismatch between the impedance of load 150 and the impedance of communications device 110. In embodiments of the invention, impedance matching module 130 comprises one or more thin film capacitors. In other embodiments, impedance matching module 130 comprises one or more other electronic devices whose impedance can be varied using a control signal (e.g., a bias voltage). Impedance matching module 130 has at least three ports 132, 134, and 136. Port 132 is coupled to signal sensing module 120. Port 134 is coupled to impedance matching control module 140. Port 136 is coupled to load 150.

Impedance matching control module 140 generates at least one control signal that is used to varying the impedance of impedance matching module 130. In an embodiment, impedance matching control module 140 generates one or more DC bias signal that are provided to impedance matching module 130 to control the impedance of impedance matching module 130. Impedance matching module 140 has at least two ports 142 and 144. Port 142 is coupled to signal sensing module 120. Port 144 is coupled to impedance matching module 130. As will be apparent to a person skilled in the relevant communication art from the description of the invention herein, the exact implementation of impedance matching control module 140 is dependent upon the output of signal sensing module 120 and the type and magnitude of the signal needed to control the impedance of impedance matching module 130.

In an embodiment, impedance matching control module 140 comprises logic, which may include, for example, memory and a lookup table, to generate a DC bias signal proportional to a VSWR of a sensed RF signal (given input signals from signal sensing module 120 that are proportional to $V_1$ and $V_r$ of the sensed RF signal). In addition, in an embodiment, impedance matching control module 140 comprises circuitry to amplify the generated DC bias signal to a voltage range that can be used to control impedance matching module 130. For example, in embodiments of the invention, a DC bias voltage in the range of about 0 volts to about 9 volts can be used to control certain thin film parallel plate capacitors according to the invention and thereby change the impedance of impedance matching module 130. How to implement impedance matching control module 140 for a given signal sensing module 120 and a given impedance matching module 130 will be apparent to a person skilled in the relevant communications and/or electronics art.

Load 150 is a load of a type typically coupled to a communications device. For example, load 150 can be an antenna or a cable. A characteristic of load 150 is that its impedance may change with time.

Figure 3:
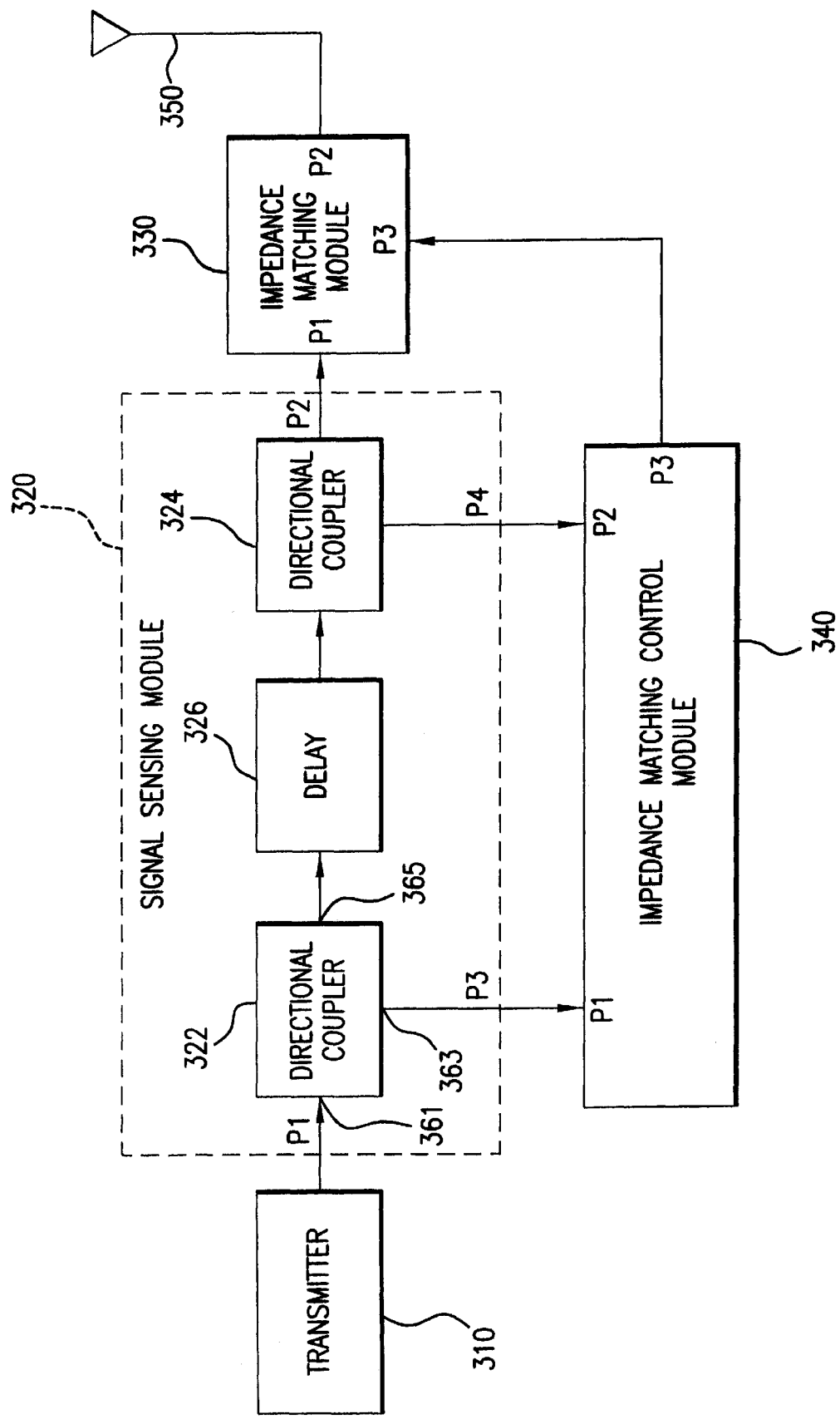
FIG. 3 illustrates a system for active impedance matching according to the present invention.

FIG. 3. illustrates a second example system 300 according to an embodiment of the present invention. System 300 comprises a transmitter 310, a signal sensing module 320, an impedance matching module 330, an impedance matching control module 340, and an antenna 350, which are coupled together as shown in FIG. 3. Each of the devices that comprise system 300 operate in a manner similar to that described above for system 100, or in a manner that would be known to a person skilled in the relevant communications art given the description of the invention herein.

As seen in FIG. 3, in an embodiment, signal sensing module 320 comprises two directional couplers 322 and 324 and a delay 326. Each of the directional couples 322 and 324 operate in a manner that would be known to a person skilled in the relevant communications art. For example, a signal input a port 361 of directional coupler 322 is reproduced at port 365, and a signal proportional to the signal input at port 361 is produced at port 363. If a signal is input at port 365 of directional coupler 322, the signal input at port 365 will be reproduced at port 361, but no signal proportional to the signal input at port 365 is produced at port 363. In a transceiver embodiment of the invention, a four-port directional coupler is used, which produces a signal proportional to the signal input at port 365 at a fourth port (not shown).

Directional couplers 322 and 324 are coupled to delay 326. In an embodiment, delay 326 is a line that is λ/4 long, where λ is the length of a period of a carrier signal being transmitted by transmitter 310. The purpose of delay 326 is to separate directional couplers 322 and 324 by the distance λ/4 so that they can be used to determine both an incident wave and a reflected wave caused by an impedance mismatch between the impedance of antenna 350 and the impedance of transmitter 310. In an embodiment, directional coupler 322 generates a secondary signal that can be used to determine the voltage of the wave incident at antenna 350, and directional coupler 324 generates a secondary signal that can be used to determine the voltage of the wave reflected at antenna 350.

In an embodiment, the secondary signals developed by signal sensing module 320 are used by impedance matching control module 340 to generate at least one DC bias voltage that is proportional to the instantaneous impedance mismatch between antenna 350 and transmitter 310. The bias signal or signals generated by impedance matching control module 340 are then applied to one or more variable impedance device (not shown) to adjust the impedance of impedance matching module 330. By adjusting the impedance of impedance matching module 330, the instantaneous impedance mismatch between antenna 350 and transmitter 310 is reduced.

Figure 4:
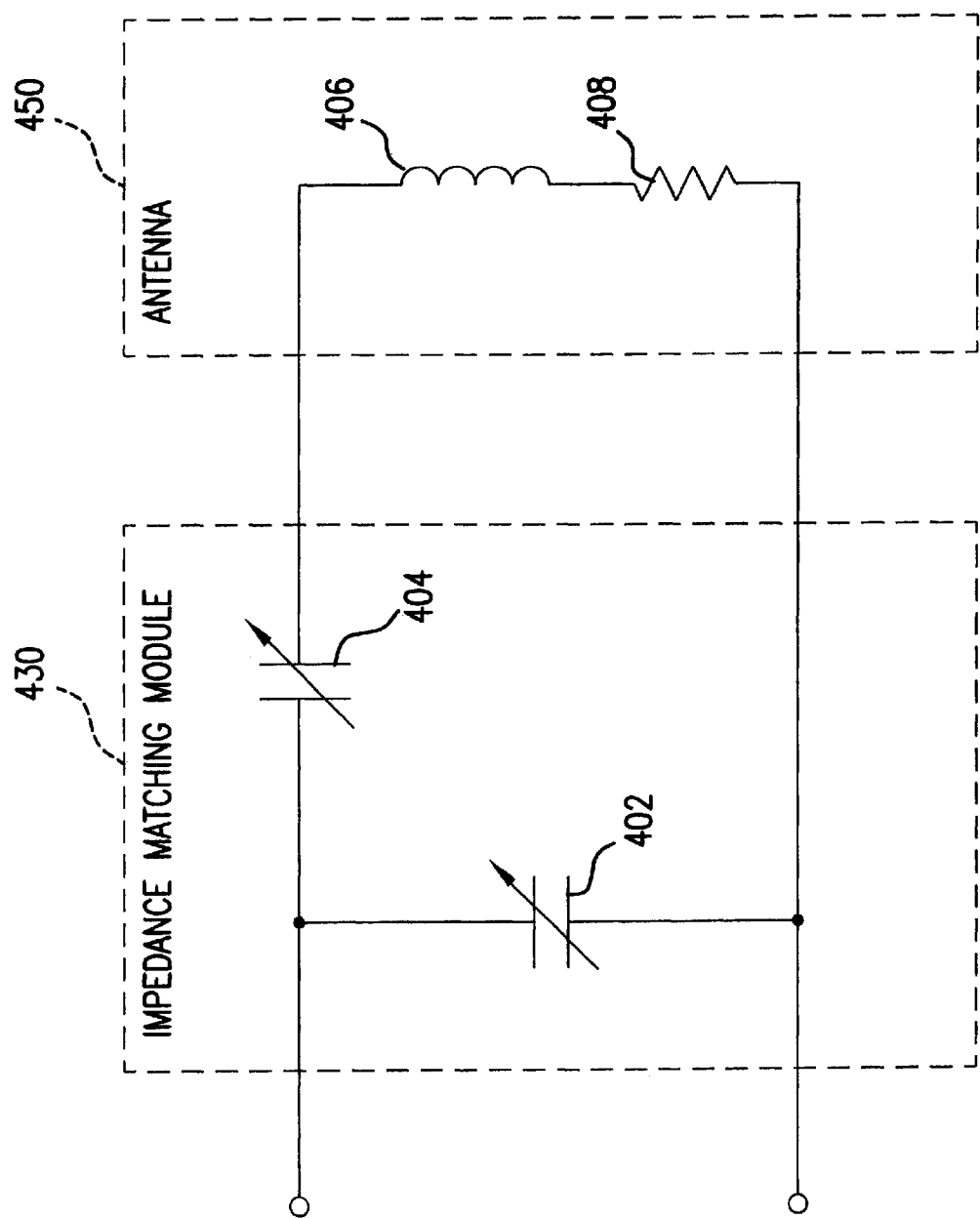
FIG. 4 illustrates an active impedance matching circuit according to the present invention coupled to a load.

FIG. 4 illustrates an impedance matching module (network) 430 according to an embodiment of the invention coupled to an antenna 450. Impedance matching module 430 is an L-shaped network that comprises two variable capacitors 402 and 404. Antenna 450 is represented in FIG. 4 as an inductor 406 and a resistance 408.

In a preferred embodiment of the invention, capacitors 402 and 404 are barium strontium titanate, thin film, parallel plate capacitors. Capacitor 404 is used to reduce the inductive nature of the antenna 450. Capacitor 402 is used to adjust the resonance frequency of the network. By adjusting the values of capacitors 402 and 404, impedance matching module 430 can be instantaneous tuned to match the impedance of antenna 450 to an impedance of a communications device (not shown).

As described herein, the instantaneous values of capacitors 402 and 404 are controlled using a feedback loop that comprises a signal sensing module and an impedance matching control module. Whenever a change of the input impedance of antenna 450 occurs, impedance matching module 430 is automatically reconfigured to compensate for the change in the impedance of antenna 450 and reduce any resulting impedance mismatch between the impedance of antenna 450 and the impedance of a communications device.

Figure 5:
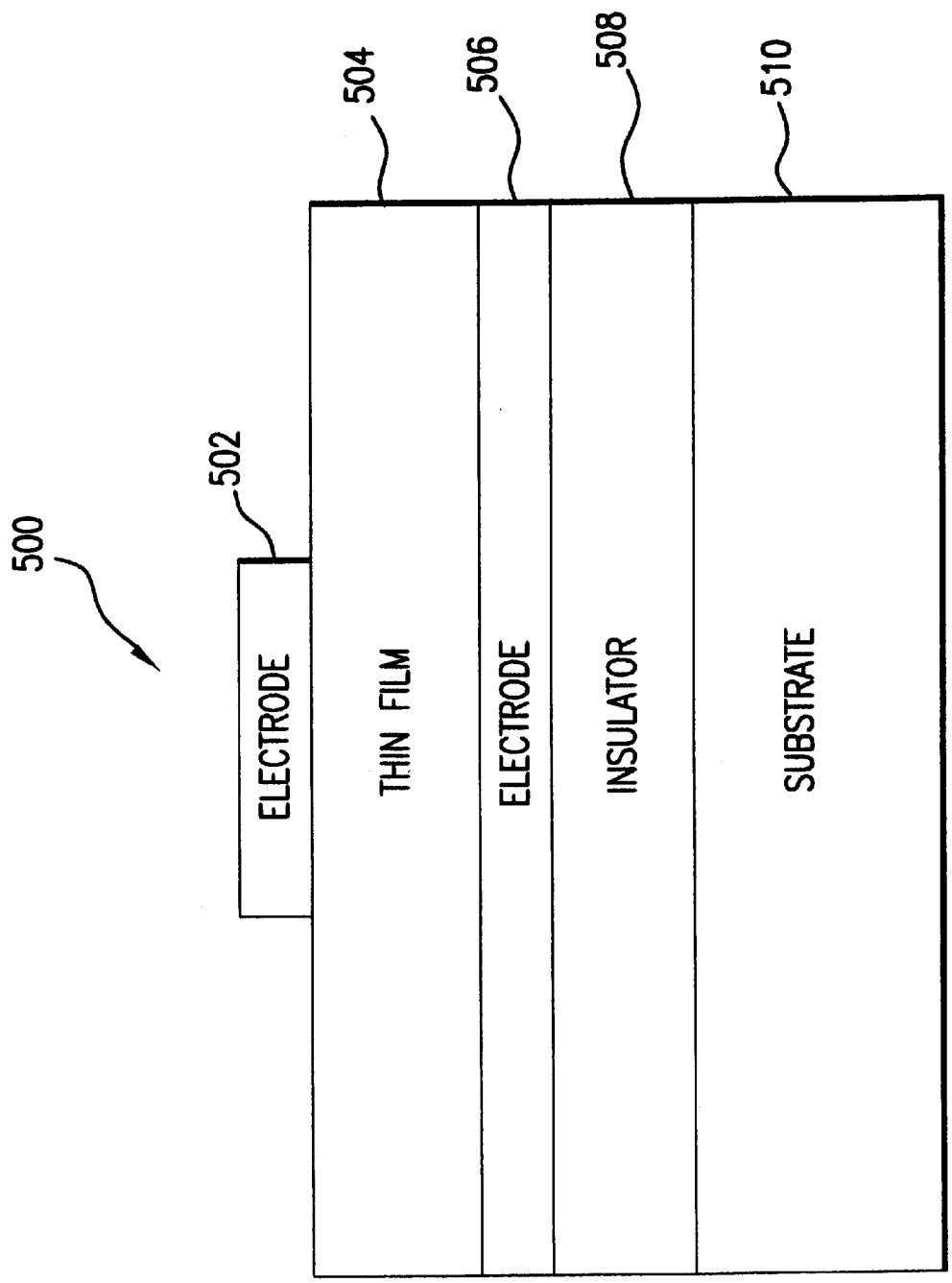
FIG. 5 illustrates a thin film capacitor according to the present invention.

FIG. 5 illustrates a thin film capacitor 500 according to an embodiment of the invention. As described herein, Capacitor 500 can be formed to have a thickness ranging from about 500 µm to about 1500 µm. Capacitor 500 can be formed on a silicon wafer.

Capacitor 500 comprises five layers 502, 504, 506, 508, and 510 of material. Capacitor 500 is formed from a ferroelectric material. A ferroelectric material is a nonlinear dielectric having a permittivity that is a function of an applied electric field. The capacitance of capacitor 500 is given by EQ. 2.

$$C = \frac{\varepsilon \cdot A}{d} \qquad \text{EQ. (2)}$$

where: C is the capacitance of the capacitor, ε is permittivity of the dielectric (ferroelectric) material; A is area of an electrode, and d is separation distance of the electrodes. As can be seen by EQ. 2, as the permittivity of capacitor 500 varies, so does its capacitance.

In an embodiment, capacitor 500 is formed to have the following characteristics. Layer 510 is a substrate such as, for example, silicon (e.g., a silicon wafer). In one embodiment, layer 510 has a thickness of about 500 microns. Layer 508 is silicon dioxide ($SiO_2$) having a thickness of about 600–800 Å. Layer 506 is a layer of about 1500 Å of platinum. Layer 506 acts as a bottom contact for capacitor 500, and it is typically used as a ground contact. Layer 506 can be deposited onto layer 508 using known deposition techniques. Layer 504 is a thin film having a thickness on the order of about 3000–6000 Å. Layer 504 can be grown using metalorganic chemical vapor deposition (MOCVD). In a preferred embodiment, layer 504 comprises barium strontium titanate ($Ba_{0.7}Sr_{0.3}TiO_3$). MOCVD is a preferred means growing a barium strontium titanate thin film because it provides good composition control, homogeneity of the film, and large area coverage. Layer 502 is a layer of about 1500 Å of platinum. After deposition of layer 504, layer 502 can be deposited using a known sputtering method. To obtain the best electrical properties, layer 502 (i.e., the top electrode) must be anneal after deposition at about 520° C. for about 25 minutes in air. By using this annealing process, dielectric dispersion and loss in the thin film of layer 504 film are reduced.

Figure 6:
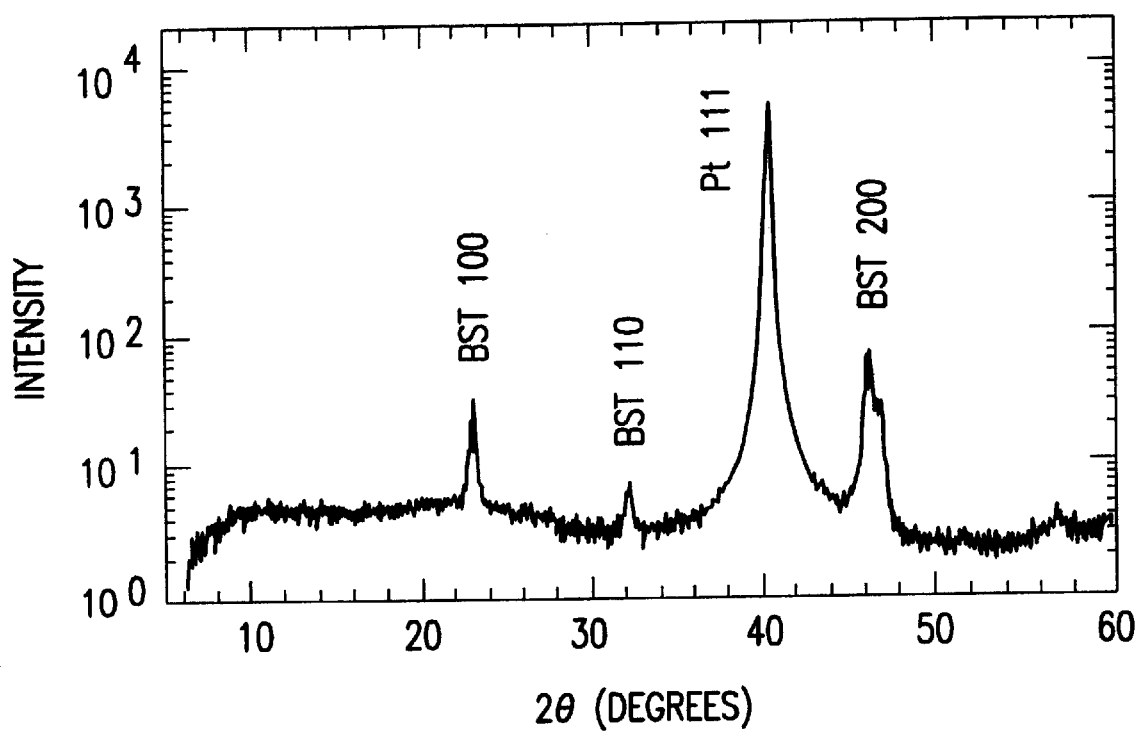
FIG. 6 illustrates an example x-ray diffraction of a thin film capacitor according to the present invention.

FIG. 6 illustrates a typical x-ray diffraction pattern for a barium strontium titanate (BST) thin film capacitor 500, formed on silicon, and using platinum electrodes. The pattern shows perovskite single phase. The presence of only BST 100, BST 110 and BST 200 reflections indicates that only crystalline orientations are present. A comparison with high purity powder diffraction data indicates that a predominant orientation is x00 normal to the substrate plane. This orientation is important because it guarantees a uniform microstructure and desirable electrical properties. An important factor in accordance with the invention in reducing the loss in the thin film of layer 504 is the presence of titanium in excess in a range between about 1–3%. This titanium excess also reduces the permittivity of the thin film material.

Figure 7:
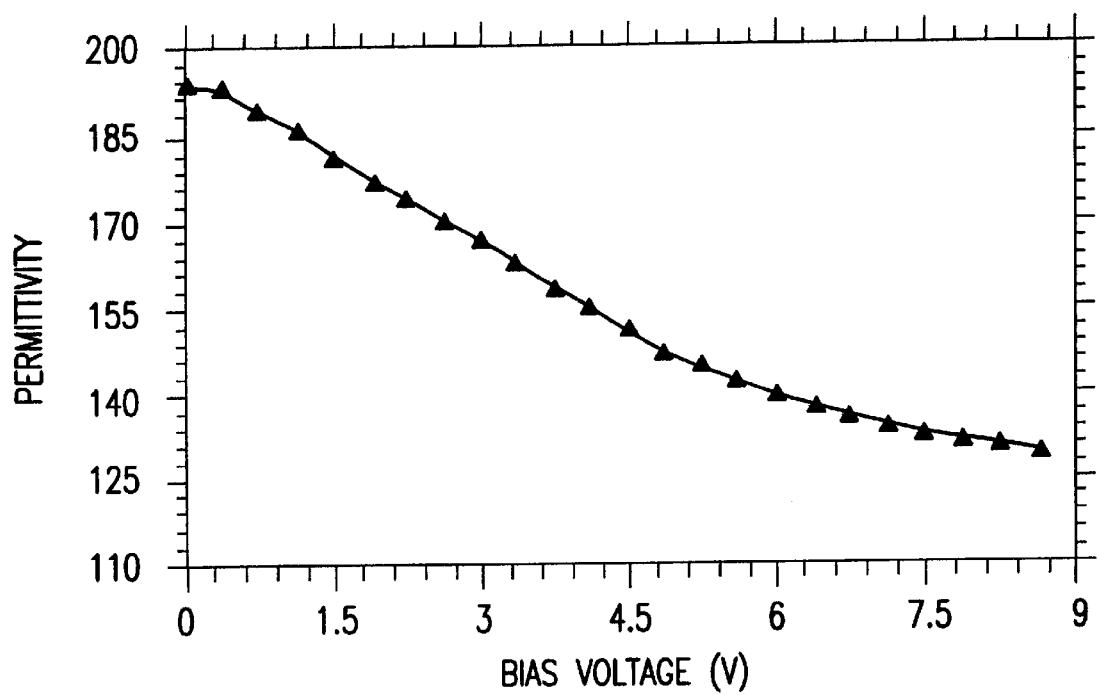
FIG. 7 illustrates an example plot of permittivity as a function of applied DC bias voltage for a thin film capacitor according to the present invention.

A typical permittivity of a 650 Å barium strontium titanate thin film capacitor 500, operating at 1 GHz, for different bias voltage is illustrated in FIG. 7. As can be seen in FIG. 7, a change of 28% in the permittivity is observed at 1 GHz with a bias voltage of 6 volts. The corresponding loss tangent values are in the range of 0.04.

Figure 8:
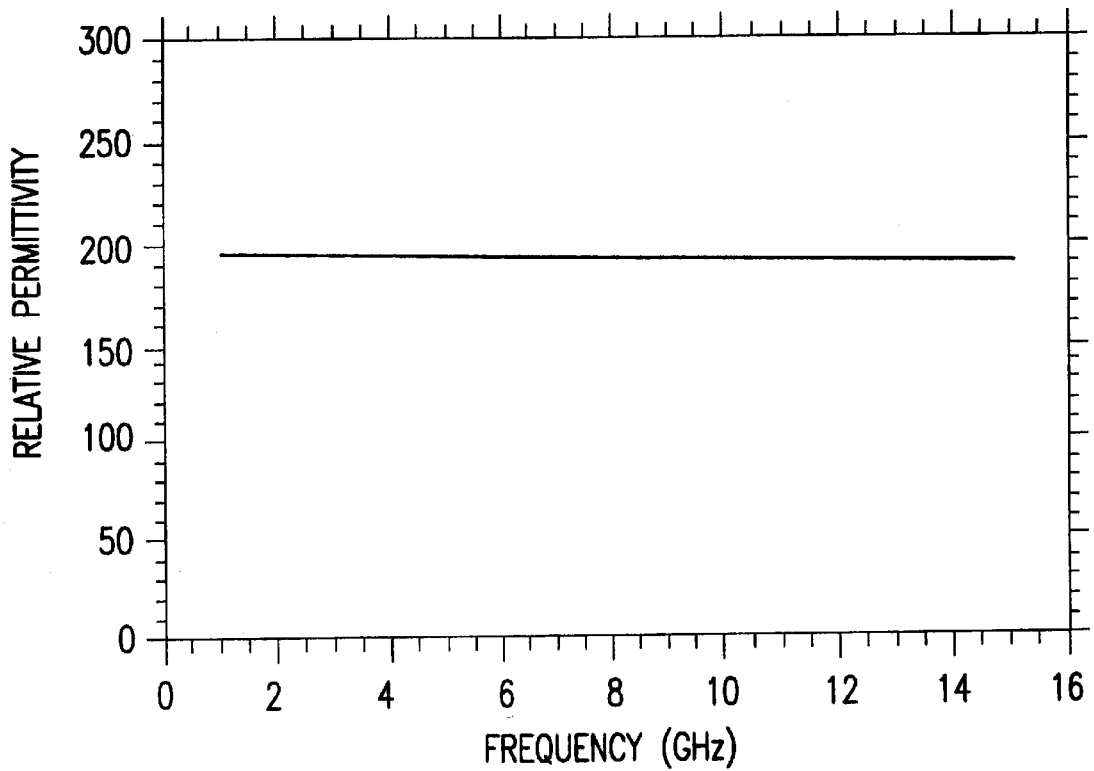
FIG. 8 illustrates an example plot of relative permittivity as a function of frequency for a thin film capacitor according to the present invention.

The behavior of a barium strontium titanate capacitor 500 versus frequency is illustrated in FIG. 8. As can be seen, a very low dielectric dispersion (e.g., less then 1%) is obtainable, making a barium strontium titanate capacitor 500 according to the invention an ideal variable impedance device for broadband applications according to the invention.

As described herein, in embodiments of the invention, thin film capacitors 500 according to the invention are to be formed directly on a silicon substrate, for example, utilizing the back side of a chip. This choice guarantees minimal wafer contamination, and it permits large areas to be used for forming the capacitors 500.

In embodiments of the invention, variable impedance devices other than thin film capacitors are used. For example, in an embodiment, impedance matching module 130 comprises one or more varactor diodes. A varactor diode is a semiconductor device whose capacitance is a function of an applied reverse voltage, as would be known to a person skilled in the relevant arts. Other types of controllable impedance devices can also be used form an active impedance matching network in accordance with the invention. Thus, as will be understood by a person skilled in the relevant communications technology given the description herein, the particular characteristics shown in FIGS. 6–7 are illustrative and not intended to limit the invention. Other variable impedance devices according to the invention can have other characteristics.

Figure 9:
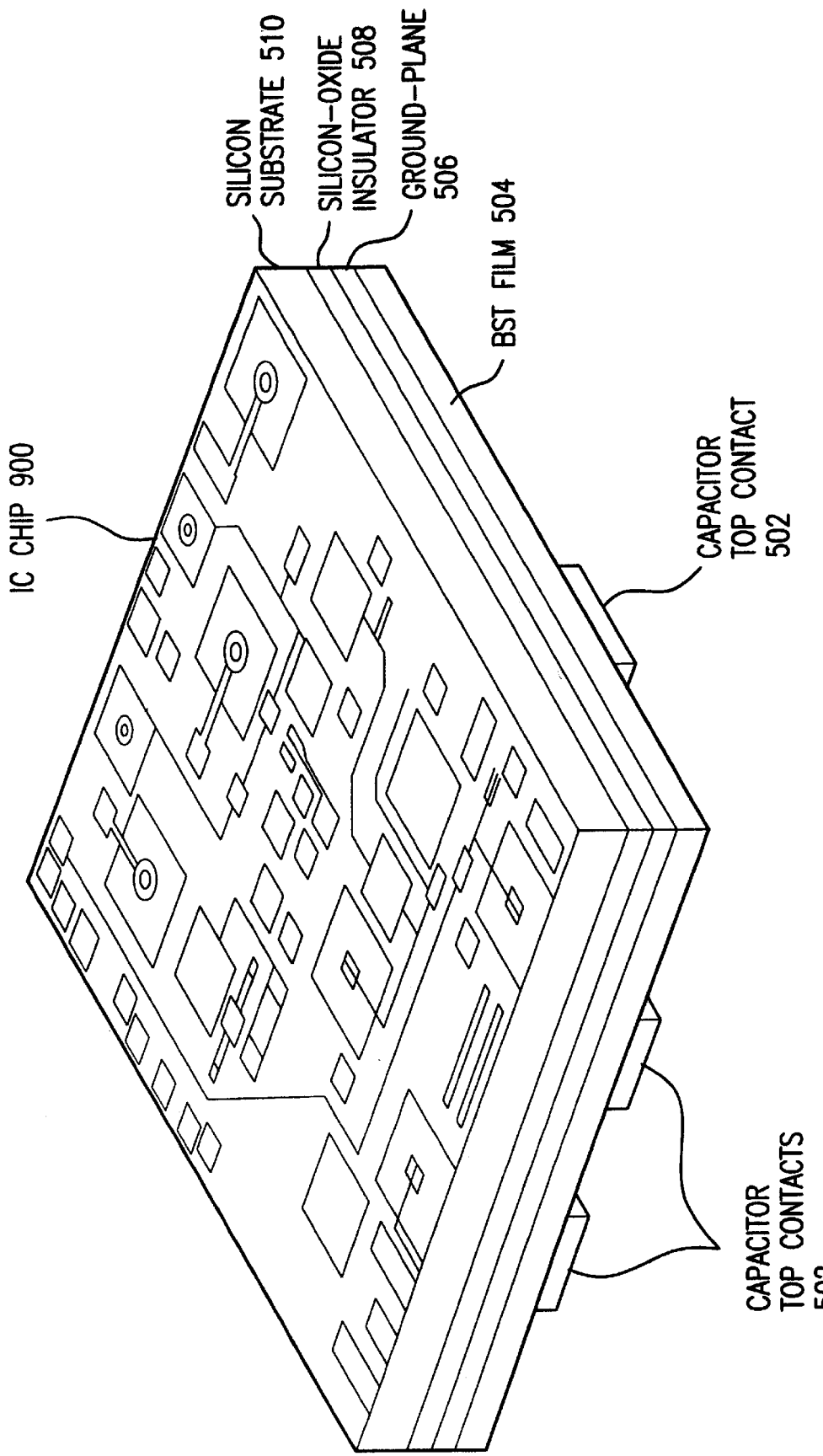
FIG. 9 illustrates an integrated circuit according to an embodiment of the present invention.

FIG. 9 illustrates one possible implementation of a system according to the invention on a integrated circuit (IC) chip 900. IC chip 900 comprises a silicon substrate 510, a silicon oxide insulator 508, a ground plane 506, a barium strontium titanate (BST) thin film 504, and capacitor top contacts 502.

Figure 10:
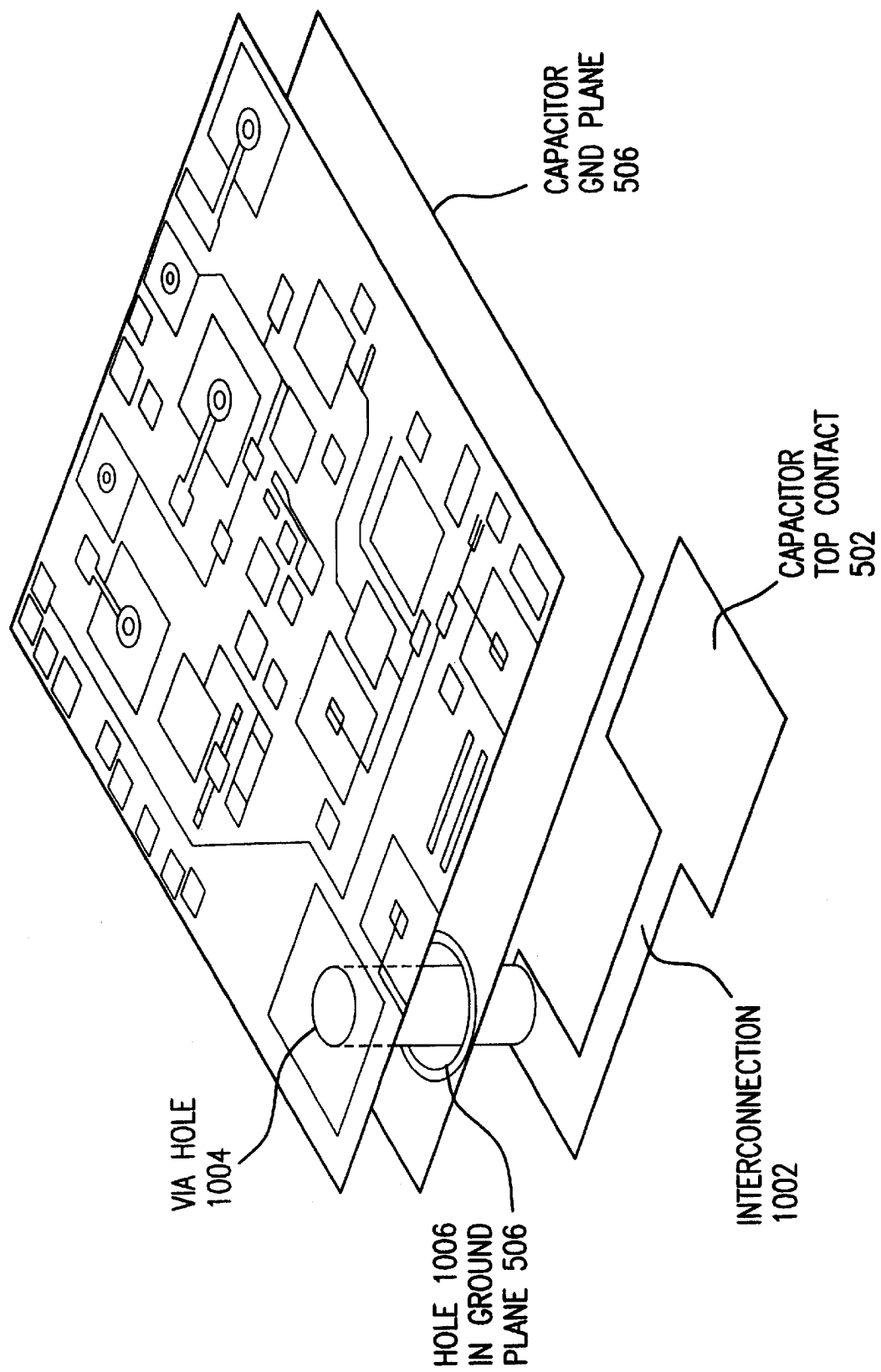
FIG. 10 illustrates an example interconnection an integrated circuit according to an embodiment of the present invention.

A means for interconnection of the capacitors top electrode 502 to the IC chip 900 is illustrated in FIG. 10. As shown in FIG. 10, an interconnection 1002 can be formed using a via hole 1004 through the silicon substrate 510 and through a hole 1006 in the ground plane 506.

The various system embodiments of the invention described herein have been presented by way of example only, and not limitation.

Example Method Embodiment of the Present Invention

Figure 11:
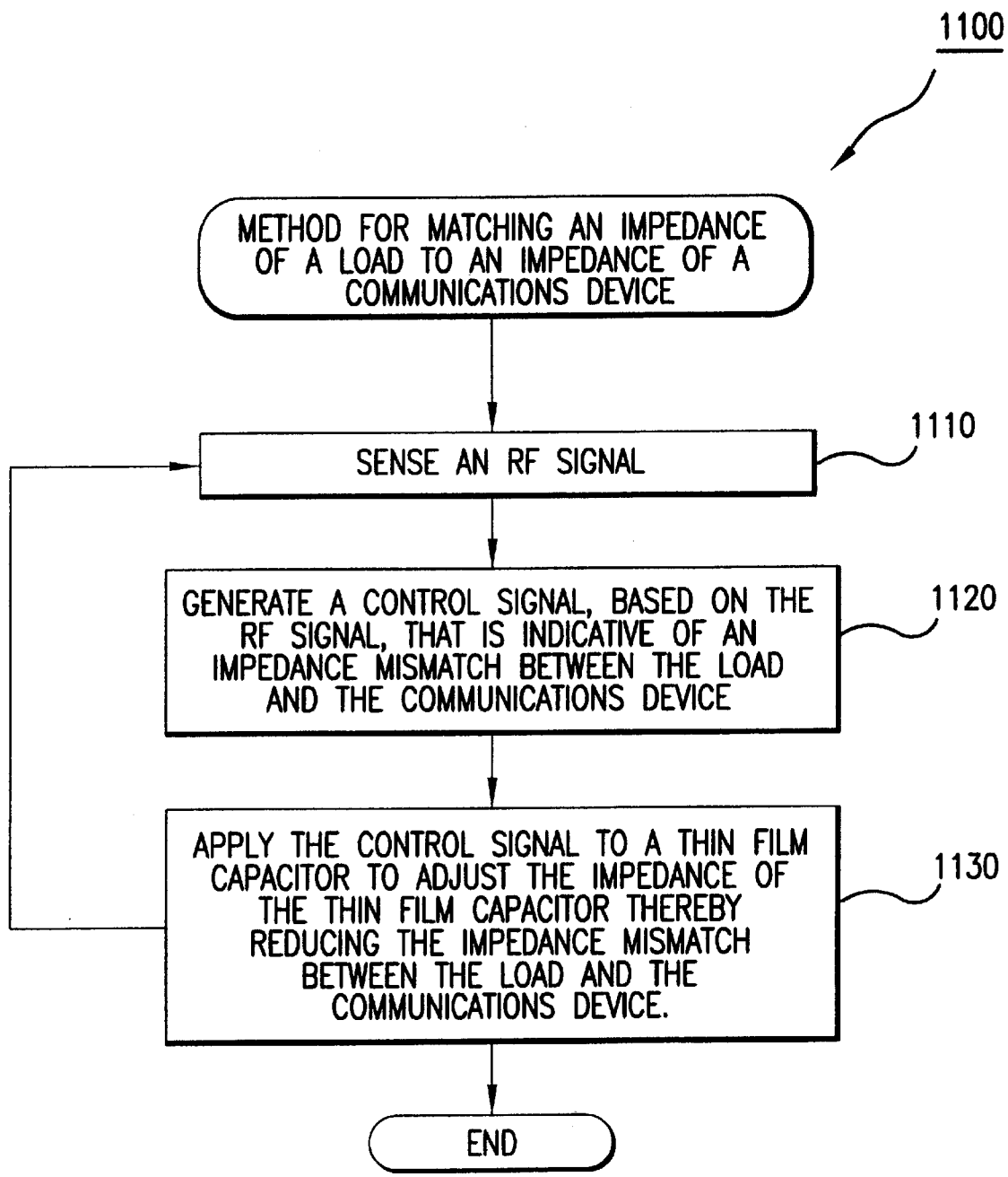
FIG. 11 illustrates a flowchart of a method embodiment of the present invention.

FIG. 11 illustrates a flowchart of a method 1100 for matching an impedance of a load to an impedance of a communications device. This method can be implemented using system embodiments of the present invention (e.g., system 100), and it is described with reference to the features illustrated in FIG. 1. As described below, the method comprises three steps 1110, 1120, and 1130.

In step 1110, a signal sensing module 120 is used to sense a radio frequency signal. The radio frequency signal sensed is representative of an impedance mismatch between the impedance of load 150 and communications device 110. In an embodiment, signal sensing module 120 is used to obtain a first signal that is representative of a voltage wave incident at load 150, and to obtain a second signal that is representative of a voltage wave reflected at load 150. The output or outputs of signal sensing module 120 are provided to impedance matching control module 140.

In step 1120, impedance matching control module 140 is used to generate a control signal, using the signal or signals obtained from signal sensing module 120, that is indicative of an impedance mismatch between load 150 and communications device 110. In an embodiment, the generated control signal is one or more DC bias signals, in a range between 0 and 10 volts. Other control signals are generated in other embodiments of the invention.

In step 1130, the control signal generated in step 1120 is applied to a variable impedance device to adjust an impedance of impedance matching network 130. Adjusting the impedance of impedance matching network 130 reduces the impedance mismatch between the load 150 and the communications device 110. In an embodiment, the variable impedance device of impedance matching network 130 is a thin film parallel plate capacitor 500.

It is a feature of method 1100 that it can be used actively match the impedance of an antenna to a receiver, a transmitter, or a transceiver, even when a human body proximate to the antenna affects the impedance of the antenna.

Further features and advantages of method 1100 will be apparent to a person skilled in the relevant communications art given the description of the invention herein.

Conclusion

Various embodiments of the present invention have been described above. It should be understood that these embodiments have been presented by way of example only, and not limitation. It will be understood by those skilled in the relevant art that various changes in form and details of the embodiments described above may be made without departing from the spirit and scope of the present invention as defined in the claims. Thus, the breadth and scope of the present invention should not be limited by any of the above-described exemplary embodiments, but should be defined only in accordance with the following claims and their equivalents.

What is claimed is:

1. A system for coupling a load to a communications device comprising:

a signal sensing module having at least a first, second, and third port;

an impedance matching module that is automatically reconfigured to match a load whose impedance changes over time, said impedance matching module having at least a first, second, and third port; and an impedance matching control module having at least a first and second port, wherein said first port of said signal sensing module is for coupling to the communications device, said second port of said signal sensing module is coupled to said first port of said impedance matching module, said third port of said signal sensing module is coupled to said first port of said impedance matching control module, said second port of said impedance matching control module is coupled to said third port of said impedance matching module, and said second port of said impedance matching module is for coupling to the load, wherein said signal sensing module comprises a first directional coupler having at least a first and second port, said first port for coupling to the communications device, and said second port coupled to said impedance matching control logic module, and wherein said signal sensing module further comprises a second directional coupler having at least a first, second, and third port, and a delay having a first and second port, wherein said first port of said delay is coupled to a third port of said first directional coupler, said second port of said delay is coupled to said first port of said second directional coupler, said second port of said second direction coupler is coupled to said impedance matching control module, and said third port of said second directional coupler is for coupling to the load.

2. The system of claim 1, wherein said impedance matching module comprises:

a first thin film capacitor, a permittivity of said first thin film capacitor being a function of a bias voltage applied to said first thin film capacitor.

3. The system of claim 2, wherein said first thin film capacitor is a barium strontium titanate capacitor.

4. The system of claim 3, wherein said first thin film capacitor is a parallel plate capacitor fabricated on a semiconductor wafer.

5. The system of claim 4, wherein said first thin film capacitor has a thickness in a range from about 500 microns to about 1,500 microns.

6. A system for coupling a load to a communications device comprising:

a signal sensing module having at least a first, second, and third port;

an impedance matching module that is automatically reconfigured to match a load whose impedance changes over time, said impedance matching module having at least a first, second, and third port; and an impedance matching control module having at least a first and second port, wherein said first port of said signal sensing module is for coupling to the communications device, said second port of said signal sensing module is coupled to said first port of said impedance matching module, said third port of said signal sensing module is coupled to said first port of said impedance matching control module, said second port of said impedance matching control module is coupled to said third port of said impedance matching module, and said second port of said impedance matching module is for coupling to the load, wherein said impedance matching module comprises a first thin film capacitor, a permittivity of said first thin film capacitor being a function of a bias voltage applied to said first thin film capacitor, and wherein said impedance matching module further comprises a second thin film capacitor, a permittivity of said second thin film capacitor being a function of a bias voltage applied to said second thin film capacitor.

7. The system of claim 6, wherein said first and second thin film capacitors are parallel plate capacitors fabricated on a semiconductor wafer.

8. The system of claims 7, wherein said first and second thin film capacitors are barium strontium titanate capacitors.

9. A method for automatically matching an impedance of a load to an impedance of a communications device, comprising the steps of:

(1) sensing a radio frequency signal;

(2) generating a control signal, based on the radio frequency signal, that is indicative of an impedance mismatch between the load and the communications device, wherein said impedance mismatch is caused by impedance changes of the load over time; and (3) applying the control signal to a thin film capacitor to adjust an impedance of the thin film capacitor thereby reducing the impedance mismatch between the load and the communications device, wherein step (1) comprised the steps of obtaining a first signal that is representative of a voltage wave incident at the load, and obtaining a second signal that is representative of a voltage wave reflected at the load, and wherein the first and second signals are obtained using a first and second directional coupler.

10. The method of claim 9, wherein the control signal is a DC voltage.

11. The method of claim 9, wherein the thin film capacitor is a barium strontium titanate parallel plate capacitor.

12. A method for automatically matching an impedance of an antenna to an impedance of a communications device, comprising the steps of:

(1) sensing a radio frequency signal;

(2) generating a control signal, based on the radio frequency signal, that is indicative of an impedance mismatch between the antenna and the communications device, wherein said impedance mismatch is caused by impedance changes of the antenna over time;

(3) applying the control signal to a variable impedance device thereby reducing the impedance mismatch between the antenna and the communications device, wherein step (1) comprises the steps of obtaining a first signal that is representative of a voltage wave incident at the antenna, and obtaining a second signal that is representative of a voltage wave reflected at the antenna, and wherein the first and second signals are obtained using a first and second directional coupler.

13. The method of claim 12, wherein the variable impedance device is a varactor diode.

14. A system for coupling a load to a communications device, comprising:

an impedance matching module that couples the communications device to the load, said impedance matching module comprising a variable impedance device having a controllable impedance, said impedance matching module having a first thin film capacitor and a second thin film capacitor;

a signal sensing module, coupled to the communications device and the load, that develops a reference signal proportional to a signal being transferred between the communications device and the load, wherein said signal being transferred varies in response to impedance changes of the load over time; and an impedance matching control module, coupled to said impedance matching module and said signal sensing module, that automatically generates a control signal, based on said reference signal, for controlling the impedance of said variable impedance device.

15. The system of claim 14, wherein said first thin film capacitor is a parallel plate capacitor having a ferroelectric thin film dielectric.

16. The system of claim 15, wherein said ferroelectric thin film dielectric is barium strontium titanate.

17. The system of claim 16, wherein said first thin film capacitor is fabricated on a semiconductor wafer.

18. The system of claim 16, wherein said first thin film capacitor has a thickness in a range from about 500 microns to about 1,500 microns.

19. The system of claim 14, wherein said first thin film capacitor is a capacitor having a permittivity that is a function of an applied bias voltage.

20. The system of claim 14, wherein the load is an antenna.

* * * * *